(12) United States Patent
Motoi

(10) Patent No.: US 10,044,379 B2
(45) Date of Patent: Aug. 7, 2018

(54) TRANSMITTER, SIGNAL SYNTHESIS CIRCUIT, AND SIGNAL SYNTHESIS METHOD

(71) Applicant: NEC Corporation, Tokyo (JP)

(72) Inventor: Keiichi Motoi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/525,197

(22) PCT Filed: Jul. 30, 2015

(86) PCT No.: PCT/JP2015/003833
§ 371 (c)(1),
(2) Date: May 8, 2017

(87) PCT Pub. No.: WO2016/079906
PCT Pub. Date: May 26, 2016

(65) Prior Publication Data
US 2017/0317697 A1    Nov. 2, 2017

(30) Foreign Application Priority Data
Nov. 19, 2014  (JP) ................. 2014-234630

(51) Int. Cl.
H04L 27/00    (2006.01)
H04B 1/04     (2006.01)
H03F 3/24     (2006.01)

(52) U.S. Cl.
CPC .............. *H04B 1/04* (2013.01); *H03F 3/245* (2013.01); *H03F 2200/336* (2013.01); *H03F 2200/387* (2013.01)

(58) Field of Classification Search
CPC .................. H04L 27/2627; H04L 27/2649
See application file for complete search history.

(56) References Cited

U.S. PATENT DOCUMENTS

| 5,930,128 A | 7/1999 | Dent |
| 6,133,788 A | 10/2000 | Dent |

(Continued)

FOREIGN PATENT DOCUMENTS

| EP | 2 602 930 A1 | 6/2013 |
| EP | 2897288 A1 | 7/2015 |

(Continued)

OTHER PUBLICATIONS

International Search Report corresponding to PCT/JP2015/003833, 2 pages, dated Oct. 27, 2015.

(Continued)

*Primary Examiner* — Shuwang Liu
*Assistant Examiner* — Gina McKie
(74) *Attorney, Agent, or Firm* — Wilmer Cutler Pickering Hale and Dorr LLP

(57) ABSTRACT

A multi-bit digital signal that is generated by modulating a baseband signal by a modulation circuit and includes components in a radio frequency band is amplified by switch-mode amplifiers (100-1, 100-2) on a bit-by-bit basis, amplified signals are band-limited by frequency-variable variable band limiting units (201-1, 201-2) and thereafter subjected to voltage-to-current conversion by voltage/current source conversion units (202-1, 202-2) provided with variable capacitances, the signals converted to current are synthesized at a synthesis point X, and a resultant signal is impedance-corrected by an impedance correction unit (203) and output as a transmission signal to an antenna of a load (300). Consequently, the present invention provides a transmitter capable of synthesizing output signals from a plurality of switch-mode amplifiers and transmitting a resultant signal while maintaining an impedance characteristic with respect to a plurality of transmit frequencies without increasing a circuit size.

10 Claims, 13 Drawing Sheets

(56) References Cited

U.S. PATENT DOCUMENTS

| | | |
|---|---|---|
| 6,311,046 B1 | 10/2001 | Dent |
| 2008/0290938 A1 | 11/2008 | Gupta et al. |
| 2012/0032738 A1* | 2/2012 | Uchiyama ............. H03F 1/0288 330/124 R |
| 2013/0016795 A1 | 1/2013 | Kunihiro et al. |
| 2013/0142283 A1 | 6/2013 | Hori |
| 2015/0022461 A1 | 1/2015 | Kempin et al. |
| 2015/0222461 A1* | 8/2015 | Motoi ..................... H03F 1/565 375/295 |

FOREIGN PATENT DOCUMENTS

| | | |
|---|---|---|
| JP | 2002-510927 A | 4/2002 |
| JP | 5609890 B2 | 10/2014 |
| WO | WO-1999/052206 A1 | 10/1999 |
| WO | WO-2008/150341 A1 | 12/2008 |
| WO | WO-2012/017580 A1 | 2/2012 |
| WO | WO-2014/042205 A1 | 3/2014 |

OTHER PUBLICATIONS

Written Opinion of the International Search Authority corresponding to PCT/JP2015/003833 with English translation, 5 pages, dated Oct. 27, 2015.

H. Zhang and K. J. Chen, "A Stub Tapped Branch-Line Coupler for Dual-Band Operations," IEEE Microwave and Wireless Components Letters, vol. 17, Issue 2, Feb. 2007, pp. 106-108.

P. Colantonio et al., "Design of a dual-band GaN Doherty amplifier,"Microwave Radar and Wireless Communications (MIKON), 2010 18th International Conference On, pp. 1-4, vol. Issue:, Jun. 14-16, 2010.

T. S. Horng et al., "A Novel Modified-T Equivalent Circuit for Modeling LTCC Embedded Inductors with a Large Bandwidth," IEEE Microwave Theory and Techniques, vol. 51, Issue 12, pp. 2327-2333, Dec. 2003.

* cited by examiner

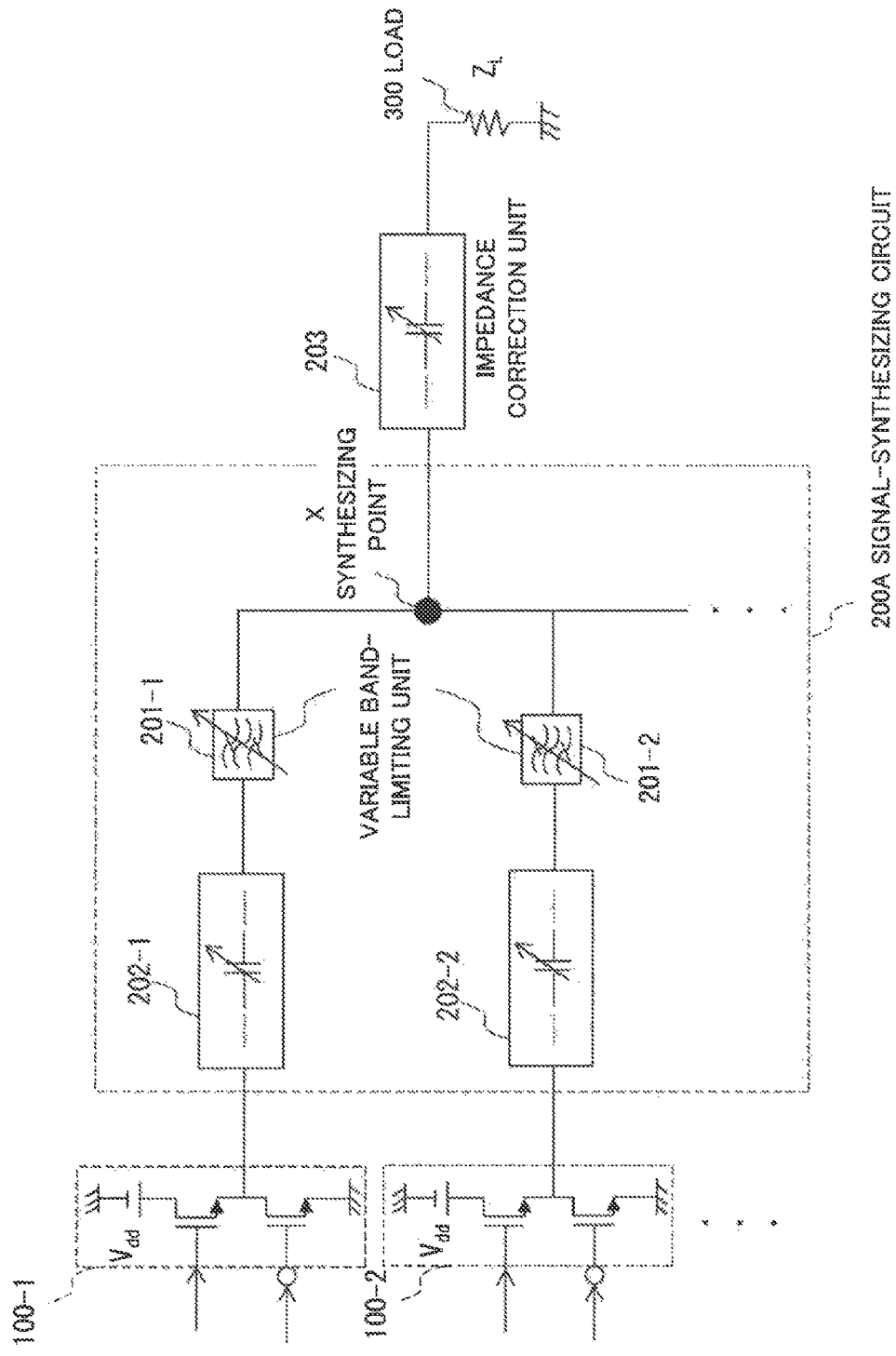

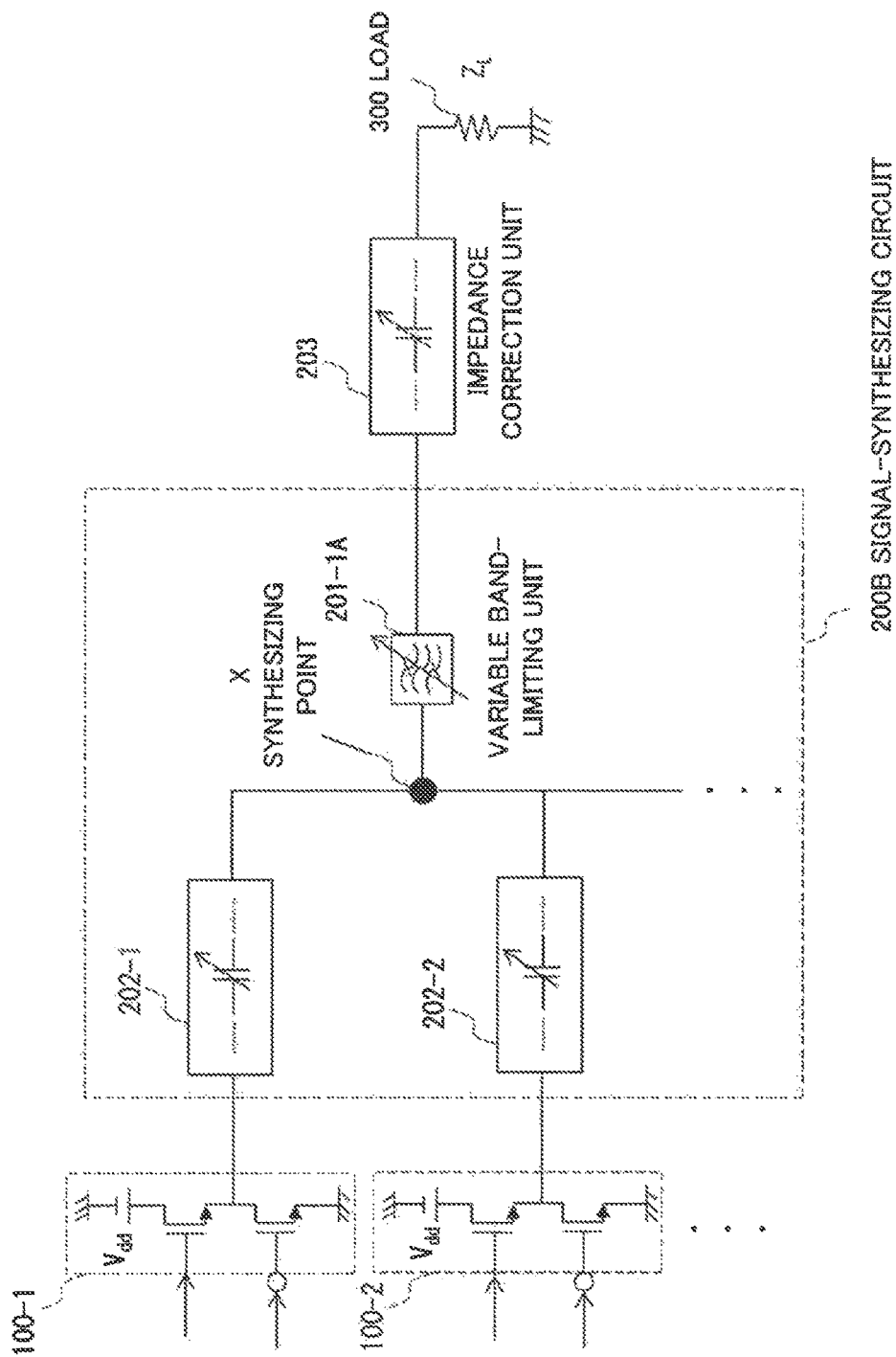

US 10,044,379 B2

TRANSMITTER, SIGNAL SYNTHESIS CIRCUIT, AND SIGNAL SYNTHESIS METHOD

CROSS-REFERENCE TO RELATED APPLICATIONS

This application is a national stage application of International Application No. PCT/JP2015/003833 entitled "TRANSMITTER, SIGNAL SYNTHESIS CIRCUIT, AND SIGNAL SYNTHESIS METHOD," filed on Jul. 30, 2015, which claims the benefit of the priority of Japanese Patent Application No. 2014-234630 filed on Nov. 19, 2014, the disclosures of each of which are hereby incorporated by reference in their entirety.

TECHNICAL FIELD

The present invention relates to a transmitter, a signal-synthesizing circuit, and a signal-synthesizing method, and more particularly, to a transmitter, a signal-synthesizing circuit, and a signal-synthesizing method that are capable of synthesizing signals of a plurality of radio frequencies. The present invention can be suitably applied as, for example, a transmitter that synthesizes output signals obtained by amplifying a multi-bit digital signal including a radio frequency band component by a plurality of switch-mode amplifiers and transmits the synthesized signal.

BACKGROUND ART

A base station of a wireless communication system transmits a signal with a large difference between average power and peak power. In recent years, a digital transmitter that converts a baseband signal to be transmitted into a digital transmission signal including a radio frequency band component and amplifies the signal has been studied as a technique for improving efficiency of a transmission amplifier used for a transmitter such as the base station as mentioned above. As an amplifier to be applied, for example, a switch-mode amplifier such as a D-class amplifier and an S-class amplifier has been studied.

A switch-mode amplifier amplifies power, assuming that a pulse waveform signal is used as an input signal, while a pulse waveform of the input signal is maintained. The pulse waveform signal amplified in the switch-mode amplifier is output from the digital transmitter after frequency components other than a desired radio signal band are removed.

There is a demand for increasing an output of transmission power of a transmission signal or further enhancing purity and quality of the transmission signal. Synthesizing digital transmission signals is effective as a means for further enhancing the transmission power, and purity and quality of the transmission signal.

In addition, to cope with the recent rapid increase in mobile traffic and improvement in communication rate using a carrier aggregation (CA) for allowing a plurality of frequency bands to be adapted to communication at the same time, the number of frequency bands to be applied to communication has been increasing and it has been necessary for a radio transmitter and a power amplifier to be compatible with a plurality of frequency bands.

As a signal-synthesizing means for digital transmission signals in a digital transmitter, for example, as described in PTL1 of International Publication No. WO2014/042205 "TRANSMITTER, SIGNAL-SYNTHESIZING CIRCUIT, SIGNAL-SYNTHESIZING METHOD", there has been proposed a means including a band-limiting unit that band-limits output signals from a plurality of switch-mode amplifiers, and a voltage/current source conversion unit that converts the output signals from the switch-mode amplifiers from voltage to current, the band-limiting unit and the voltage/current source conversion unit being connected to thereby synthesize signals.

For example, FIG. 7 is a block diagram illustrating an overall configuration of the transmitter described in the above-mentioned PTL1. The transmitter includes a digital baseband signal generation unit 410, a modulation circuit 420, switch-mode amplifiers 100-1 and 100-2, a signal-synthesizing circuit 200, and an antenna (load) 300. As described later, the signal-synthesizing circuit 200 includes a band-limiting unit and a voltage/current source conversion unit.

However, in the above-mentioned PTL1, NPL1 of "A Stub Tapped Branch-Line Coupler for Dual-Band Operations," (IEEE Microwave and Wireless Components Letters, Vol. 17, Issue 2, February 2007) by H. Zhang et al., and NPL2 of "Design of a dual-band GaN Doherty amplifier," (Microwave Radar and Wireless Communications, 2010) by P. Colantonio, a configuration using a plurality of transmission lines as illustrated in FIGS. 8A and 8B is illustrated as a specific configuration of a ¼ wavelength transmission line adaptable as a component of a signal-synthesizing circuit compatible with a single transmission frequency or two transmission frequencies. However, there is a problem that a circuit size increases as the number of transmission frequency bands increases, which makes it difficult to achieve a downsized signal-synthesizing circuit compatible with a plurality of transmission frequencies. In this regard, FIG. 8A is a block diagram illustrating a configuration example in which the voltage/current source conversion unit described in the above-mentioned PTL1 is configured to be compatible with two frequencies, and FIG. 8B is a block diagram illustrating another configuration example in which the voltage/current source conversion unit described in the above-mentioned PTL1 is configured to be compatible with two frequencies.

Further, as described in the above-mentioned PTL1, as a means for implementing a signal-synthesizing circuit to be compatible with a plurality of transmission frequencies, there is a means in which a band-limiting unit and a voltage/current source conversion unit are provided as a signal-synthesizing circuit and the voltage/current source conversion unit is provided with ¼ wavelength transmission lines as illustrated in FIGS. 8A and 8B of a synthesizing circuit unit for each of transmission frequencies $f_1, f_2, \ldots$, and the ¼ wavelength transmission lines are switched by changeover switches (RF switches) 220-3, 220-4, 220-5, 220-6, ... as illustrated in FIG. 9. FIG. 9 is a block diagram illustrating a configuration example in which the signal-synthesizing circuit described in the above-mentioned PTL1 is configured to be compatible with a plurality of frequencies. However, in the case of the signal-synthesizing circuit as illustrated in FIG. 9, when the number of syntheses of the power amplifier (PA) is represented by N and the number of transmission frequency bands is represented by M, (N×M) ¼ wavelength transmission lines are required, which causes a problem that a size of the signal-synthesizing circuit increases along with an increase in the number of syntheses and the number of bands.

Further, as a means for achieving a downsized signal-synthesizing circuit compatible with a plurality of transmission frequencies, it is possible to employ a means for allowing a passive element such as a variable capacitance and a variable inductor using an RF-MEMS (Radio Frequency Micro-Electro-Mechanical System) or the like to be adaptable to the signal-synthesizing circuit of a lumped-constant configuration illustrated in the above-mentioned PTL1. However, in general, the variable inductor has a large loss, which makes it difficult to adapt the variable inductor to a power amplifier filter and a signal-synthesizing circuit which are required to have a low Q-value (Quality factor) and high efficiency. Accordingly, in practice, an adaptable variable passive element is limited only to a capacitance. This causes a problem that, when only the variable capacitance is adapted to the signal-synthesizing circuit illustrated in the above-mentioned PTL1, an impedance characteristic of the signal-synthesizing circuit fluctuates with respect to a plurality of frequencies and output power also fluctuates in accordance with the fluctuation.

CITATION LIST

Patent Literature

[PTL1] International Publication No. WO 2014/042205

Non Patent Literature

[NPL1] H. Zhang and K. J. Chen, "A Stub Tapped Branch-Line Coupler for Dual-Band Operations," IEEE Microwave and Wireless Components Letters, Vol. 17, Issue 2, February 2007, pp. 106-108.
[NPL2] P. Colantonio et al., "Design of a dual-band GaN Doherty amplifier, "Microwave Radar and Wireless Communications (MIKON), 2010 18th International Conference On, Page(s): 1-4, Volume: Issue: 14-16, June 2010.

SUMMARY OF INVENTION

Technical Problem

As mentioned above, in the prior art as described in the above-mentioned PTL1 and the above-mentioned NPL1 and NPL2, it is impossible to achieve a specific signal-synthesizing circuit capable of synthesizing output signals from a plurality of switch-mode amplifiers while maintaining impedance characteristics with respect to a plurality of transmission frequencies.

Object of the Present Invention

The present invention has been made in view of the above-mentioned problems, and an object of the present invention is to provide a transmitter, a signal-synthesizing circuit, and a signal-synthesizing method that are capable of synthesizing output signals from a plurality of switch-mode amplifiers while maintaining impedance characteristics with respect to a plurality of transmission frequencies, without increasing a circuit size even in a circuit configuration in which a variable part is limited only to a variable capacitance.

Solution to Problem

To solve the above-mentioned problems, a transmitter, a signal-synthesizing circuit, and a signal-synthesizing method according to the present invention mainly adopt the following characteristical configurations.

(1) A transmitter according to a present invention comprises:
a modulation circuit configured to modulate a baseband signal into a multi-bit digital signal including a component in a radio frequency band;
a switch-mode amplifier disposed corresponding to each bit of the multi-bit digital signal output from the modulation circuit and configured to amplify the multi-bit digital signal on a bit-by-bit basis;
a signal-synthesizing circuit configured to signal-synthesize the multi-bit digital signal output from the respective switch-mode amplifiers as a transmission signal; and
an antenna configured to transmit the transmission signal, wherein
the signal-synthesizing circuit includes:
frequency-variable band-limiting means for band-limiting an output signal from each of the switch-mode amplifiers;
voltage/current source conversion means for converting an output signal from each of the band-limiting means from voltage to current, the voltage/current source conversion means including at least a variable capacitance; and
a synthesizing point configured to connect output nodes of the respective voltage/current source conversion means and synthesize output signals output from the respective voltage/current source conversion means, and
the transmitter further comprises impedance correction means for correcting an impedance, the impedance correction means being disposed on a signal path between the synthesizing point of the signal-synthesizing circuit and the antenna serving as a load.

(2) A signal-synthesizing circuit according to a present invention, disposed in a transmitter including: a modulation circuit configured to modulate a baseband signal into a multi-bit digital signal including a component in a radio frequency band; a switch-mode amplifier disposed corresponding to each bit of the multi-bit digital signal output from the modulation circuit and configured to amplify the multi-bit digital signal on a bit-by-bit basis; and an antenna configured to transmit a transmission signal, and signal-synthesizes the multi-bit digital signal output from the respective switch-mode amplifiers as the transmission signal, the signal-synthesizing circuit comprises:
frequency-variable band-limiting means for band-limiting an output signal from each of the switch-mode amplifiers;
voltage/current source conversion means for converting an output signal from each of the band-limiting means from voltage to current, the voltage/current source conversion means including at least a variable capacitance; and
a synthesizing point configured to connect output nodes of the respective voltage/current source conversion means and synthesize output signals output from the respective voltage/current source conversion means,
wherein an output signal from the synthesizing point is further output to the antenna via impedance correction means for correcting an impedance.

(3) A signal-synthesizing method according to a present invention, for signal-synthesizing a multi-bit digital signal output from each of switch-mode amplifiers as a transmission signal in a transmitter including: a modulation circuit configured to modulate a baseband signal into the multi-bit digital signal including a component in a radio frequency band; the switch-mode amplifier disposed corresponding to each bit of the multi-bit digital signal output from the modulation circuit and configured to amplify the multi-bit digital signal on a bit-by-bit basis; and an antenna configured to transmit the transmission signal, the signal-synthesizing method comprises:

a frequency-variable band-limiting step of band-limiting each signal amplified in each of the switch-mode amplifiers;

a voltage/current source conversion step of converting each signal band-limited in the band-limiting step from voltage to current by using at least a variable capacitance;

a synthesizing step of synthesizing each signal converted to current in the voltage/current source conversion step; and an impedance correction step of correcting an impedance of a signal synthesized in the synthesizing step and outputting the signal to the antenna.

Advantageous Effects of Invention

A transmitter, a signal-synthesizing circuit, and a signal-synthesizing method according to the present invention can provide the following advantageous effects.

In other words, the transmitter according to the present invention includes at least: a modulation circuit configured to modulate a baseband signal into a multi-bit digital signal including a component in a radio frequency band; a switch-mode amplifier configured to amplify the multi-bit digital signal output from the modulation circuit for each bit; a frequency-variable band-limiting unit configured to band-limit each of output signals from the switch-mode amplifier; a voltage/current source conversion unit configured to perform voltage-to-current conversion of each of output signals from the band-limiting unit; a synthesizing point configured to synthesize output signals from the voltage/current source conversion unit; and an impedance correction unit disposed on a signal path between the synthesizing point and an antenna serving as a load and configured to correct an impedance. Since the configuration in which a variable part is limited only to a variable capacitance part is employed, it is possible to synthesize the output signals (multi-bit digital transmission signals) from a plurality of switch-mode amplifiers while maintaining impedance characteristics with respect to a plurality of transmission frequencies, and to transmit the synthesized signal as a transmission signal, without increasing a circuit size.

BRIEF DESCRIPTION OF DRAWINGS

FIG. 2B is a block diagram illustrating a second configuration example of the basic configuration of the signal-synthesizing circuit in the transmitter illustrated in FIG. 1.

FIG. 2C is a block diagram illustrating a third configuration example of the basic configuration of the signal-synthesizing circuit in the transmitter illustrated in FIG. 1.

DESCRIPTION OF EMBODIMENTS

Figure 1:
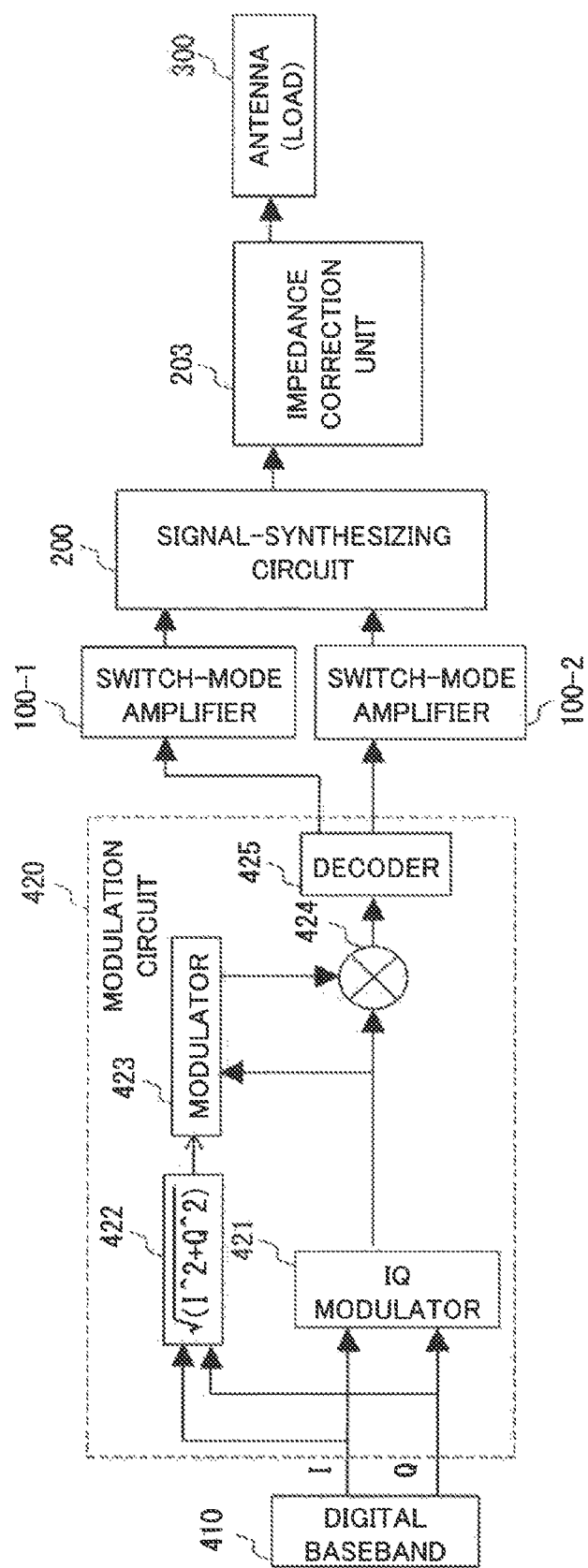
FIG. 1 is a block diagram illustrating an example of an overall configuration of a transmitter according to an example embodiment of the present invention.

Preferred example embodiments of a transmitter, a signal-synthesizing circuit, and a signal-synthesizing method according to the present invention will be described below with reference to the accompanying drawings. Note that the following reference numerals assigned to each element in the drawings are illustrated for convenience by way of example to facilitate the understanding of the invention and it is needless to say that they are not intended to limit the present invention to the illustrated modes.

Features of the Present Invention

Prior to giving the description of example embodiments of the present invention, the outline of features of the present invention will be described first. The present invention has the following main features. In other words, a transmitter includes at least: a modulation circuit configured to modulate a baseband signal into a multi-bit digital signal including a component in a radio frequency band; switch-mode amplifiers disposed corresponding to each bit of the multi-bit digital signal output from the modulation circuit and configured to amplify the multi-bit digital signal on a bit-by-bit basis; a signal-synthesizing circuit configured to synthesize the multi-bit digital signal output from each of the switch-mode amplifiers as a transmission signal; and an antenna configured to transmit the transmission signal. The signal-synthesizing circuit includes at least: a frequency-variable band-limiting unit configured to band-limit output signals from each of the switch-mode amplifiers; a voltage/current source conversion unit including at least a variable capacitance and configured to convert the output signal from the band-limiting unit from voltage to current; and a synthesizing point configured to connect output nodes of each of the voltage/current source conversion units and synthesize the output signals output from each of the voltage/current source conversion units. The transmitter further includes an impedance correction unit configured to correct an impedance and disposed on a signal path between the synthesizing point of the signal-synthesizing circuit and the antenna serving as a load.

In this case, a configuration in which variable parts are limited only to capacitance elements is adopted for circuit elements constituting each section of the signal-synthesizing circuit and the impedance correction unit. Thus, the transmitter according to the present invention can synthesize output signals from a plurality of switch-mode amplifiers while maintaining impedance characteristics with respect to a plurality of transmission frequencies, and can transmit the synthesized signal as a transmission signal without increasing the circuit size.

Configuration Example of Example Embodiments

A configuration example of a transmitter according to an example embodiment of the present invention will be described in detail with reference to FIG. 1. FIG. 1 is a block diagram illustrating an example of the overall configuration of the transmitter according to an example embodiment of the present invention. As illustrated in FIG. 1, the transmitter according to the present example embodiment includes at least a digital baseband (DBB; hereinafter abbreviated as DBB) signal generation unit 410, a modulation circuit 420, switch-mode amplifiers 100-1 and 100-2, a signal-synthesizing circuit 200, an impedance correction unit 203, and an antenna (load) 300. Note that the present example embodiment illustrates a case where the impedance correction unit 203 is disposed at a subsequent stage of the signal-synthesizing circuit 200 separately from the signal-synthesizing circuit 200. However, in some cases, the impedance correction unit 203 may be disposed in the signal-synthesizing circuit 200 (i.e., disposed at a last stage of the output side in the signal-synthesizing circuit 200).

In the transmitter illustrated in FIG. 1, for example, in W-CDMA (Wideband Code Division Multiple Access), the DBB signal generation unit 410 generates radio signals as multi-bit DBB signals I and Q of 10-bit or more. After that, the modulation circuit 420 modulates the generated DBB signals I and Q into a multi-bit digital transmission signal including a component in a radio frequency band. As illustrated in FIG. 1, the modulation circuit 420 includes at least an IQ modulator 421, a converter 422, a modulator 423, an integrator 424, and a decoder 425.

In this case, the number of bits that can be input to an amplifier, such as a D-class amplifier, which is applied to the switch-mode amplifiers 100-1 and 100-2, is generally smaller than the number of bits of the DBB signals. Therefore, in order to form the DBB signals into a form that can be input to the D-class amplifier, it is necessary to reduce the number of bits of the signals. In general, in a round-off system in which lower bits are simply rounded off, quantization noise is increased by 6 dB each time one bit is discarded. A delta-sigma ($\Delta\Sigma$) modulator which can be suitably used as the modulator 423 is a circuit technique capable of reducing the number of bits while avoiding an increase in quantization noise in a band near a desired frequency. However, a modulator other than the delta-sigma modulator may be used as the modulator 423.

The DBB signals I and Q generated by the DBB signal generation unit 410 are input to the IQ modulator 421 of the modulation circuit 420, and a pulse phase signal $\theta$ that is formed into a rectangular shape by the IQ modulator 421 is generated. The DBB signals I and Q are also input to the converter 422 of the modulation circuit 420 and are subjected to the operation of $(I^2+Q^2)^{1/2}$ by the converter 422, so that an amplitude signal r is generated.

The amplitude signal r is modulated by the modulator 423. The number of bits of the output signal from the modulator 423 is set to be equal to the number of bits that can be input to the subsequent stage of the D-class amplifier. In the configuration illustrated in FIG. 1, the two switch-mode amplifiers 100-1 and 100-2 are provided as the D-class amplifier, and therefore, the number of bits that can be input is 2.

The integrator 424 integrates the output signal from the modulator 423 with the pulse phase signal $\theta$ which is formed into a rectangular shape, so that a multi-bit (two bits in the configuration illustrated in FIG. 1; however, in general, a plurality of (two or more) bits) digital transmission signal including a component in a desired radio frequency band is generated. In this case, '1' is assigned to "High" of the rectangular pulse phase signal $\theta$ and '0' is assigned to "Low" of the rectangular pulse phase signal $\theta$. Accordingly, the number of bits of the output signal from the integrator 424 is equal to the number of bits of the output signal from the modulator 423.

The multi-bit digital transmission signal generated in the integrator 424 is input to the switch-mode amplifiers 100-1 and 100-2 via the decoder 425. In the configuration illustrated in FIG. 1, an MSB (Most Significant Bit)-side signal of the multi-bit digital transmission signals is input to one switch-mode amplifier 100-1, and an LSB (Least Significant Bit)-side signal is input to the other switch-mode amplifier 100-2. These signals are amplified in the respective switch-mode amplifiers and are then output.

Output signals from the two switch-mode amplifiers 100-1 and 100-2 are synthesized by the signal-synthesizing circuit 200, and the impedance of the synthesized signal is corrected by the impedance correction unit 203, and then the signal is transmitted via the antenna (load) 300.

Each of the units constituting the transmitter illustrated in FIG. 1 as an example embodiment of the present invention will be described below in more detail. First, as for an example embodiment of the signal-synthesizing circuit 200 in each unit of the transmitter illustrated in FIG. 1, several configuration examples compatible with a plurality of transmission frequencies while achieving miniaturization by suppressing an increase in circuit size will be described.

(1) First Configuration Example

Figure 2A:
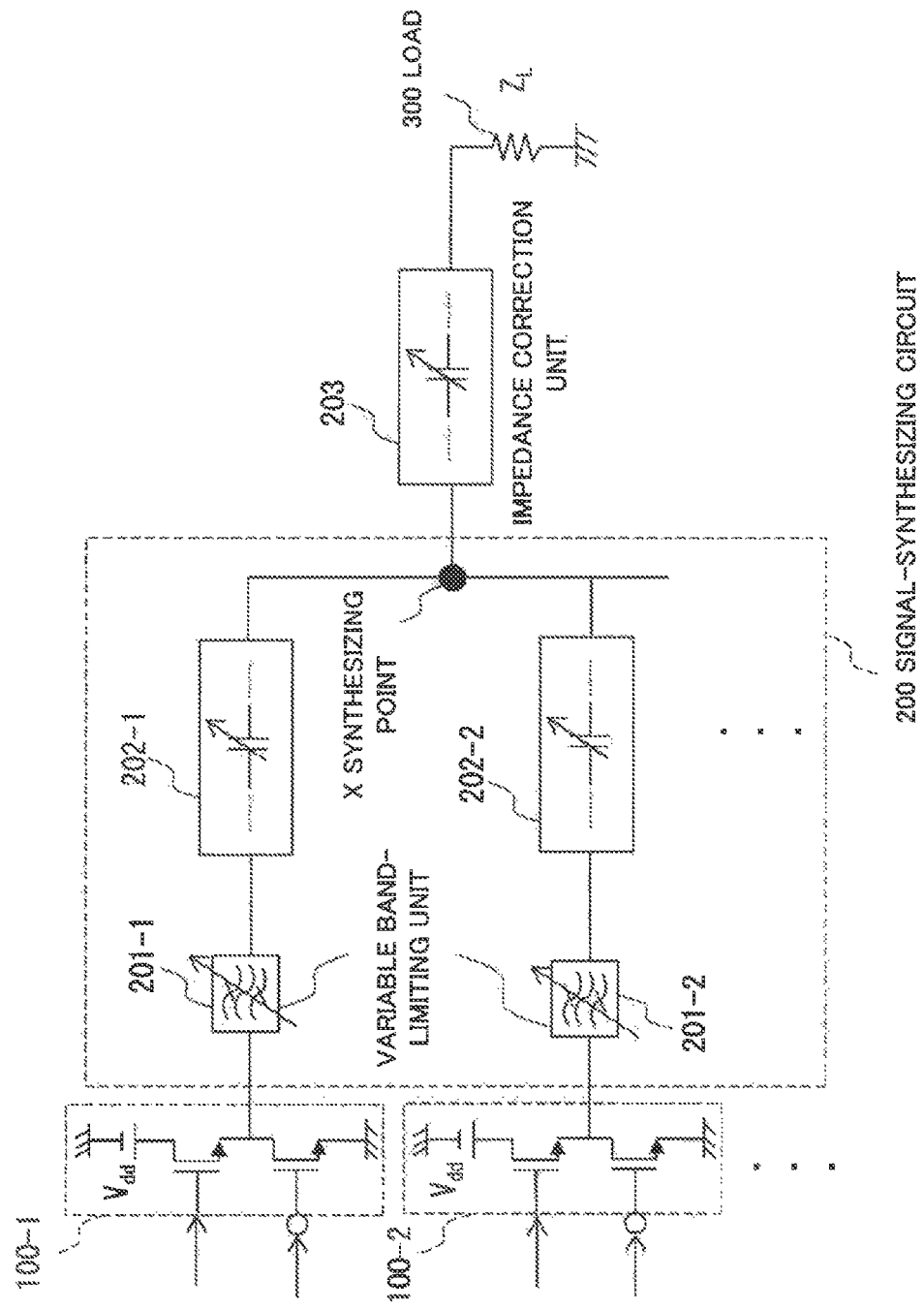
FIG. 2A is a block diagram illustrating a first configuration example of a basic configuration of a signal-synthesizing circuit in the transmitter illustrated in FIG. 1.

FIG. 2A is a block diagram illustrating a first configuration example of the basic configuration of the signal-synthesizing circuit 200 in the transmitter illustrated in FIG. 1. As illustrated in FIG. 2A, in the signal-synthesizing circuit 200 of the first configuration example, among the multi-bit digital transmission signals, the output signal from the one switch-mode amplifier 100-1 that amplifies the MSB-side digital transmission signal and the output signal from the other switch-mode amplifier 100-2 that amplifies the LSB-side digital transmission signal are band-limited to a desired frequency band. Further, the output signals are converted from voltage to current, and the digital transmission signals are synthesized at a synthesizing point X and are then output and supplied to the load 300 via the impedance correction unit 203.

In the signal-synthesizing circuit 200 illustrated in FIG. 2A, a variable filter 201-1, which is a variable band-limiting unit, and a voltage/current source conversion unit 202-1 that includes a variable capacitance and performs voltage-to-current conversion are provided on a signal path between the one switch-mode amplifier 100-1 and the synthesizing point X. A variable filter 201-2, which is a variable band-limiting unit, and a voltage/current source conversion unit 202-2 which includes a variable capacitance and performs voltage-to-current conversion are provided on a signal path between the other switch-mode amplifier 100-2 and the synthesizing point X. An impedance correction unit 203 which includes a variable capacitance and corrects an impedance is provided on a signal path between the synthesizing point X and the load 300 serving as the antenna.

The operation of the signal-synthesizing circuit 200 in the first configuration example illustrated in FIG. 2A will be described below.

One switch-mode amplifier 100-1 that amplifies the MSB-side digital transmission signal among the multi-bit digital transmission signals is configured in such a manner that, as illustrated in FIG. 2A, two switch elements are disposed in series between a power supply of a power supply voltage $V_{dd}$ Tad and a ground. The two switch elements are controlled in such a manner that one of the switch elements is turned on. Specifically, when the power-supply-side switch element is in the ON state and the ground-side switch element is in the OFF state, the output voltage of the switch-mode amplifier 100-1 becomes the power supply voltage $V_{dd}$, and in the opposite case, the output voltage becomes the ground potential. Accordingly, any switched state of the switch-mode amplifier 100-1 is equivalent to the grounded state at high frequencies, and the output from the switch-mode amplifier 100-1 can be considered to be a voltage source with a low impedance.

Figure 5A:
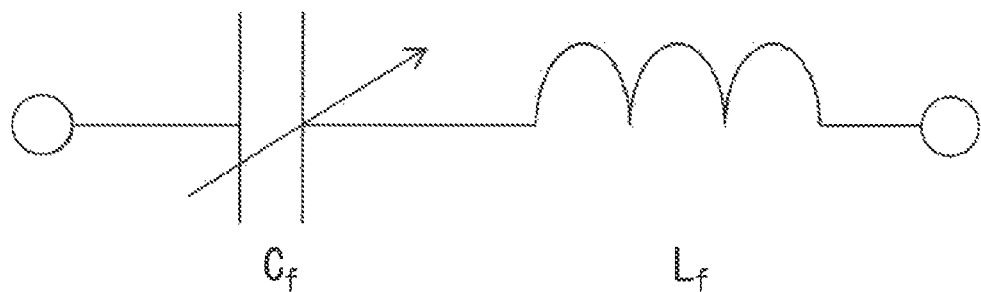
FIG. 5A is a circuit diagram illustrating a circuit configuration example of one variable filter of the signal-synthesizing circuit illustrated in FIG. 2A as the first configuration example.

One variable filter 201-1 that receives the output signal from the one switch-mode amplifier 100-1 is a circuit that band-limits the output signal from the switch-mode amplifier 100-1, allows only signals in the vicinity of a fundamental frequency $f_0$ to pass, and reflects signals in the other frequency domains. In particular, harmonic signals are totally reflected. As the variable filter 201-1, for example, an LC filter is used. Specifically, as illustrated in FIG. 5A, the variable filter 201-1 is desirably configured using an LC series resonance circuit in which a variable capacitor $C_f$ and an inductor $L_f$ are connected in series. FIG. 5A is a circuit diagram illustrating a circuit configuration example of the one variable filter 201-1 of the signal-synthesizing circuit 200 illustrated in FIG. 2A as the first configuration example. In this case, the variable capacitor $C_f$ is set so as to satisfy the following Formula (1) in accordance with the frequency $f_0$ of the transmission signal.

[Equation 1]

$$f_0 = \frac{1}{2\pi\sqrt{L_f C_f}} \tag{1}$$

Further, the one voltage/current source conversion unit 202-1 that receives the output signal from the one variable filter 201-1 converts the voltage of the output signal from the one variable filter 201-1 into a current I1.

Note that the other switch-mode amplifier 100-2 that amplifies the LSB-side digital transmission signal among the multi-bit digital transmission signals performs an operation similar to that in the one switch-mode amplifier 100-1, and the other variable filter 201-2 allows only signals in the vicinity of the fundamental frequency $f_0$ to pass, and reflects signals in the other frequency domains. Only the signals in the band which have passed through the other variable filter 201-2 are supplied to the other voltage/current source conversion unit 202-2, and the other voltage/current source conversion unit 202-2 outputs a current I2.

Further, in the signal-synthesizing circuit 200 of the first configuration example, the impedance in the vicinity of the fundamental frequency at the pre-stage of the synthesizing point X is determined during ON/OFF of the switching elements of the switch-mode amplifiers 100-1 and 100-2. However, since the impedance is low at high frequencies in the output of each of the switch-mode amplifiers 100-1 and 100-2, regardless of the state of the switch elements, the output can be considered to be a voltage source. Accordingly, due to the voltage-to-current conversion operation of the voltage/current source conversion units 202-1 and 202-2 which are respectively connected to the subsequent stages of the switch-mode amplifiers 100-1 and 100-2 via the variable filters 201-1 and 201-2, respectively, the signal-synthesizing circuit 200 is equivalent to a circuit in which the current source of the current I1 and the current source of the current I2 are connected to the synthesizing point X. Accordingly, the isolation of each port of the synthesizing point X from other ports can be secured.

Thus, the current I1 output from the one switch-mode amplifier 100-1 that amplifies the MSB-digital transmission signal and the current I2 output from the other switch-mode amplifier 100-2 that amplifies the LSB-side digital transmission signal are synthesized at the synthesizing point X, so that the output signals from the switch-mode amplifiers 100-1 and 100-2 can be synthesized.

Figure 3A:
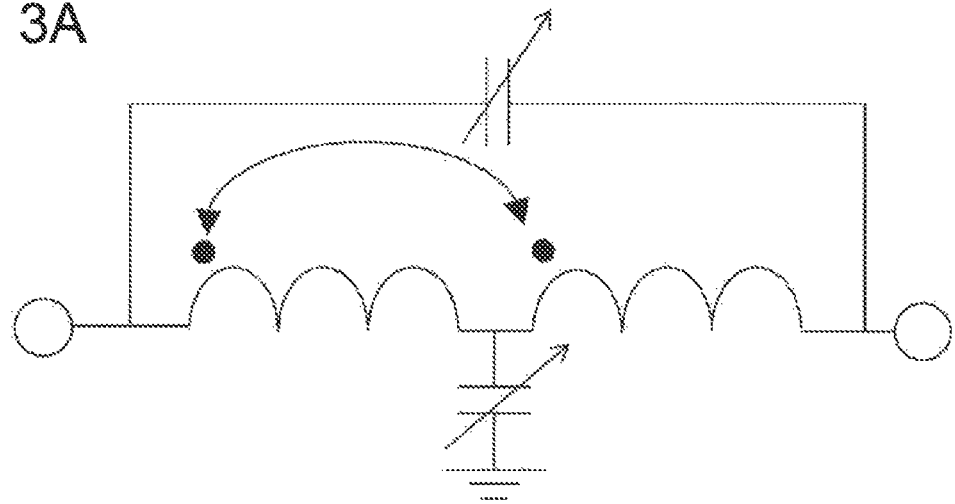
FIG. 3A is a circuit diagram illustrating a configuration example of a voltage/current source conversion unit of the signal-synthesizing circuit illustrated in FIG. 2A as the first configuration example.

In this case, as an example of the circuit configuration of the voltage/current source conversion units 202-1 and 202-2 that performs voltage-to-current conversion of the output signals from the variable filters 201-1 and 201-2, a lumped-constant equivalent circuit, which is called a bridged T-coil circuit as illustrated in FIG. 3A, of a transmission line having a characteristic impedance $Z_a$ and an electrical length $\theta_a$ (in radians) can be used. FIG. 3A is a circuit diagram illustrating a configuration example of the voltage/current source conversion units 202-1 and 202-2 of the signal-synthesizing circuit 200 illustrated in FIG. 2A as the first configuration example. The bridged T-coil circuit is described in, for example, Literature "A Novel Modified-T Equivalent Circuit for Modeling LTCC Embedded Inductors with a Large Bandwidth," T. S. Horng et al. (IEEE Microwave Theory and Techniques, vol. 51, Issue 12, December 2003, pp. 2327-2333).

In this case, when equivalent circuit parameters ($C_s$: shunt capacitance, $C_p$: a series capacitance, $L_s$: a series inductor, $L_m$: a mutual inductance) illustrated in FIG. 3A are obtained using (an angular frequency $\omega$ of a transmission frequency f)=$2\pi f$, the equivalent circuit parameter is expressed by the following Formulas (2) and (3).

[Equation 2]

$$\begin{cases} C_s = \dfrac{\theta_a}{\omega Z_a} \\ C_p = \dfrac{1}{\pi^2} \dfrac{\theta_a}{\omega Z_a} = \dfrac{C_s}{\pi^2} \\ L_s = \left(\dfrac{1}{4} + \dfrac{1}{\pi^2}\right)\dfrac{Z_a \theta_a}{\omega} \\ L_m = \left(\dfrac{1}{4} - \dfrac{1}{\pi^2}\right)\dfrac{Z_a \theta_a}{\omega} \end{cases} \quad (2)$$

[Equation 3]

$$\begin{cases} Z_a = \dfrac{1}{\sqrt{\dfrac{1}{4} + \dfrac{1}{\pi^2}}} \cdot \sqrt{\dfrac{L_s}{C_s}} \\ \theta_a = \sqrt{\dfrac{1}{4} + \dfrac{1}{\pi^2}} \cdot L_s C_s \omega^2 \end{cases} \quad (3)$$

In this case, to implement a function as a ¼ wavelength transmission line, the capacitance values of the shunt capacitance $C_s$, which is a variable capacitance, and the series capacitance $C_p$, which is proportional to the variable capacitance $C_s$, are adjusted so as to satisfy $\theta=\pi/2$ with respect to the angular frequency $\omega$ of the transmission signal.

On the other hand, as for the inductor in an example embodiment of the present invention, it is generally difficult to form a variable inductor with a low loss and a high Q-value, and in view of practical implementation, it is based on the premise that fixed inductance values are applied to the series inductor $L_s$ and the mutual inductance $L_m$. Accordingly, a constraint is generated in the following impedance characteristics.

When the frequency of the transmission signal is changed from $f_0=\omega/2\pi$ to $\alpha \times f_0 = a \cdot \omega/2\pi$ (a: any positive real number), the variable capacitance $C_s$ needs to be adjusted as illustrated in the following Formula (4) so as to maintain the relation of the electrical length $\theta_a=\pi/2$ in the changed frequency band.

[Equation 4]

$$C_s(af_0) = \dfrac{\pi/2}{L_s \cdot (a\omega_0)^2 \cdot \sqrt{\dfrac{1}{4} + \dfrac{1}{\pi^2}}} = \dfrac{1}{a^2} \dfrac{\pi/2}{L_s \cdot \omega_0^2 \cdot \sqrt{\dfrac{1}{4} + \dfrac{1}{\pi^2}}} = \dfrac{1}{a^2} \cdot C_s(f_0) \quad (4)$$

When the conditions for Formula (4) are applied to the characteristic impedance $Z_a$ of Formula (3), a characteristic impedance $Z_a$ ($af_0$) at a frequency $af_0$ is changed to an a-fold of the characteristic impedance $Z_a$ ($f_0$) at the frequency $f_0$ as illustrated in the following Formula (5).

[Equation 5]

$$Z_a(af_0) = \dfrac{1}{\sqrt{\dfrac{1}{4} + \dfrac{1}{\pi^2}}} \cdot \sqrt{\dfrac{L_s}{C_s(af_0)}} = \dfrac{1}{\sqrt{\dfrac{1}{4} + \dfrac{1}{\pi^2}}} \cdot \sqrt{\dfrac{L_s}{\dfrac{1}{a^2}C_s(f_0)}} = a \cdot Z_a(f_0) \quad (5)$$

Figure 7:
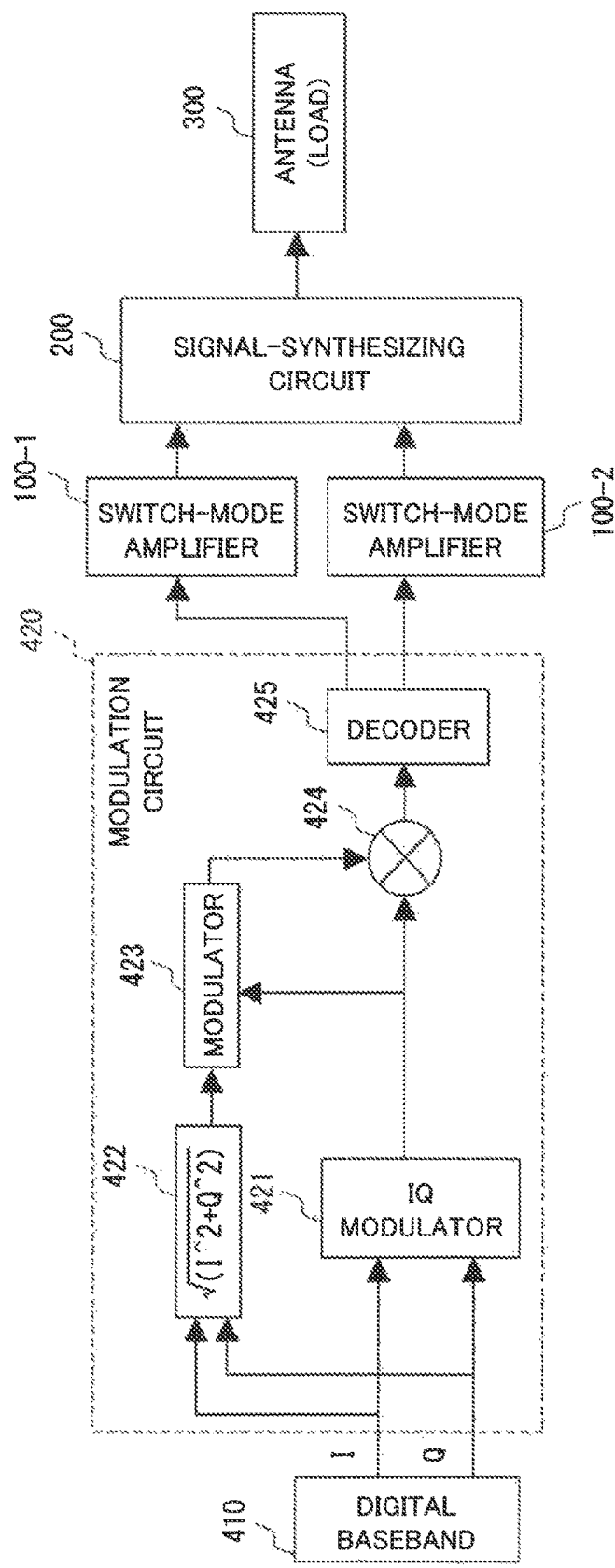
FIG. 7 is a block diagram illustrating the overall configuration of a transmitter described in the above-mentioned PTL1.
Figure 8A:
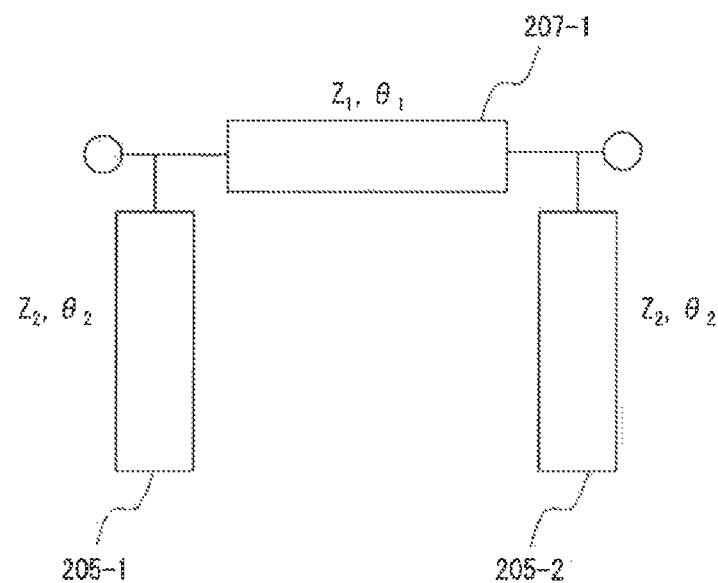
FIG. 8A is a block diagram illustrating a configuration example in which the voltage/current source conversion unit described in the above-mentioned PTL1 is configured to be compatible with two frequencies.
Figure 8B:
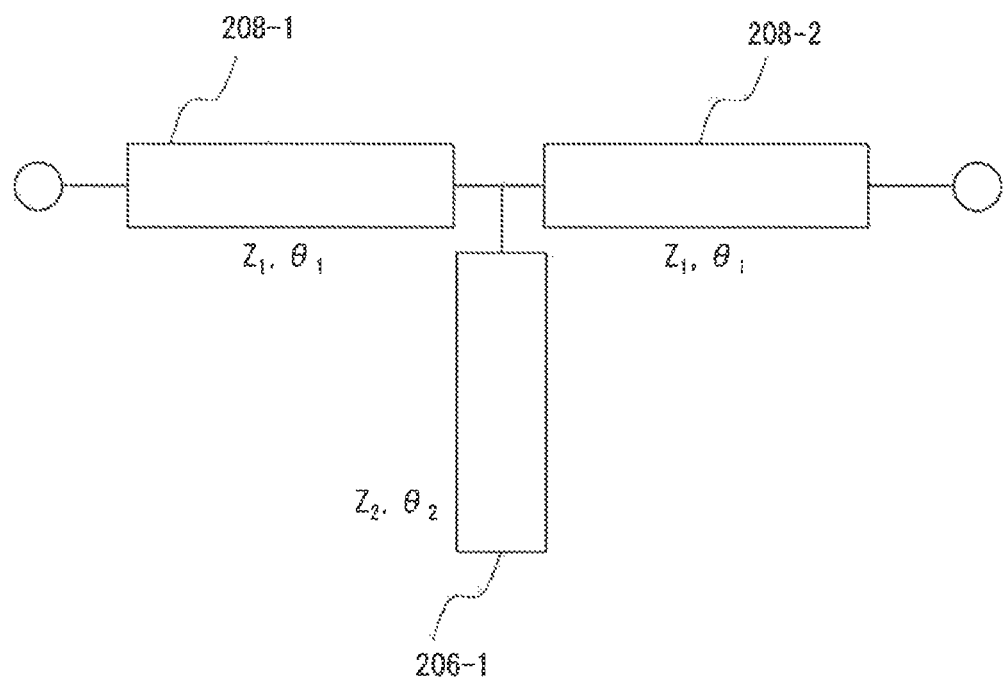
FIG. 8B is a block diagram illustrating another configuration example in which the voltage/current source conversion unit described in the above-mentioned PTL1 is configured to be compatible with two frequencies.
Figure 9:
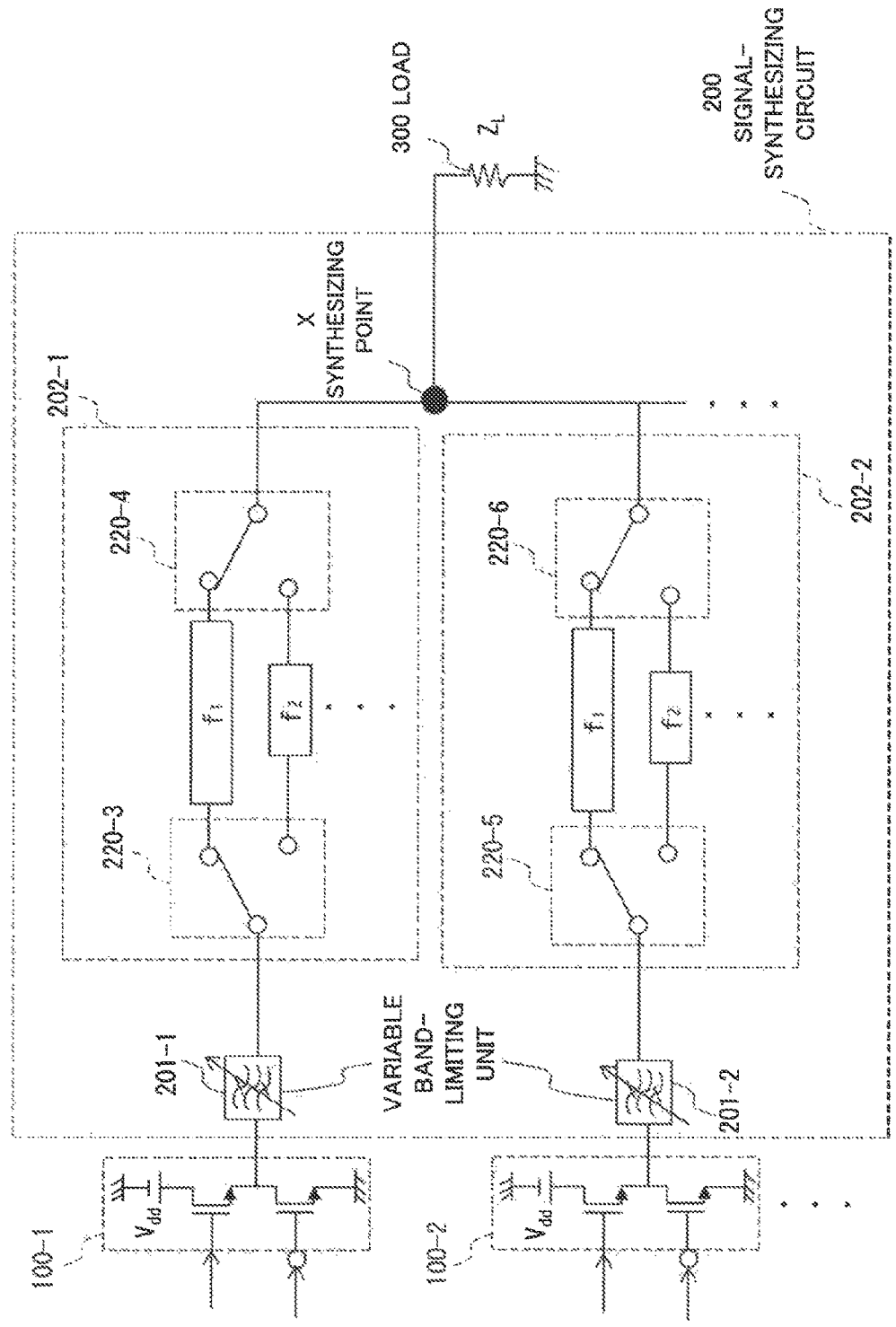
FIG. 9 is a block diagram illustrating a configuration example in which the signal-synthesizing circuit described in the above-mentioned PTL1 is configured to be compatible with a plurality of frequencies.

Accordingly, when the frequency of the transmission signal is changed from $f_0$ to $a \times f_0$, in the configuration of the transmitter as illustrated in FIG. 7 described in the prior art, for example, the above-mentioned PTL1, in which the impedance correction unit 203 included in the transmitter illustrated in FIG. 1 of this example embodiment is not incorporated, generally, in the case of n-synthesis in which n signals are synthesized, the impedance $Z_{out}(af_0)$ at the frequency $af_0$ when a load $Z_L$ is viewed from the output terminals of the switch-mode amplifiers 100-1 and 100-2, . . . is changed to an $a^2$-fold of the impedance $Z_{out}(f_0)$ at the frequency $f_0$ as illustrated in the following Formula (6). in other words, there arises a problem that the impedance $Z_{out}$ obtained when the load $Z_L$ is viewed greatly fluctuates with respect to the transmission frequency f and the signals can be synthesized, but it is difficult to maintain the output power to be constant with respect to a frequency change.

[Equation 6]

$$Z_{out}(af_0) = \dfrac{Z_a(af_0)^2}{nZ_L} = \dfrac{\{a \cdot Z_a(f_0)\}^2}{nZ_L} = a^2 \cdot \dfrac{Z_a(f_0)^2}{nZ_L} = a^2 \cdot Z_{out}(f_0) \quad (6)$$

Figure 4A:
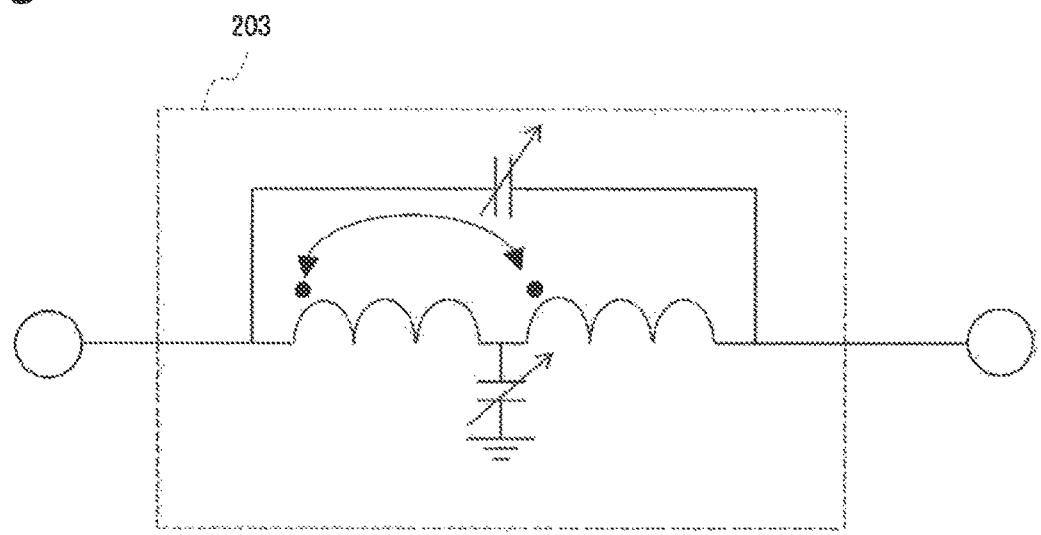
FIG. 4A is a circuit diagram illustrating a specific circuit configuration example of an impedance correction unit disposed at a subsequent stage of the signal-synthesizing circuit illustrated in FIG. 2A as the first configuration example.

On the other hand, in the first configuration example, as illustrated in FIG. 1, the impedance correction unit 203 is incorporated at the subsequent stage of the synthesizing point X of the signal-synthesizing circuit 200. Accordingly, the fluctuation in the impedance $Z_{out}$ with respect to a change in the transmission frequency f can be corrected and the output power can be maintained. As an example of a specific circuit configuration of the impedance correction unit 203, a bridged T-coil circuit including a variable capacitance, for example, as illustrated in FIG. 4A, can be applied, as with the case of the voltage/current source conversion units 202-1 and 202-2 illustrated in FIG. 3A. FIG. 4A is a circuit diagram illustrating a specific circuit configuration example of the impedance correction unit 203 which is disposed at the subsequent stage of the signal-synthesizing circuit 200 illustrated in FIG. 2A as the first configuration example.

In this case, a characteristic impedance of an equivalent transmission line of the impedance correction unit 203 illustrated in FIG. 4A is represented by $Z_b$ and the electrical length is represented by $\theta_b=\pi/2$. When equivalent circuit parameters ($C_s'$: a shunt capacitance, $C_p'$: a series capacitance, $L_s'$: a series inductor, $L_m'$: a mutual inductance) illustrated in FIG. 4A are obtained using (the angular frequency $\omega$ of the transmission frequency f)=$2\pi f$, the equivalent circuit parameters are expressed as the following Formula (7).

[Equation 7]

$$\begin{cases} C'_s = \dfrac{\theta_b}{\omega Z_b} \\ C'_p = \dfrac{1}{\pi^2}\dfrac{\theta_b}{\omega Z_b} = \dfrac{C'_s}{\pi^2} \\ L'_s = \left(\dfrac{1}{4} + \dfrac{1}{\pi^2}\right)\dfrac{Z_b \theta_b}{\omega} \\ L'_m = \left(\dfrac{1}{4} - \dfrac{1}{\pi^2}\right)\dfrac{Z_b \theta_b}{\omega} \end{cases} \quad (7)$$

As with the case where the bridged T-coil is applied to the voltage/current source conversion units 202-1 and 202-2, when the frequency of the transmission signal is changed from $f_0$ to $a \times f_0$, the characteristic impedance $Z_a(af_0)$ at the frequency $af_0$ is also changed to an a-fold of the characteristic impedance $Z_a(f_0)$ at the frequency $f_0$, as illustrated in the following Formula (8), also for the characteristic impedance $Z_b$ of the impedance correction unit 203.

[Equation 8]

$$Z_b(af_0) = a \cdot Z_b(f_0) \quad (8)$$

Accordingly, an impedance $Z_X(af_0)$ at the frequency $af_0$ when the load $Z_L$ is viewed from the synthesizing point X of the signal-synthesizing circuit 200 is changed to an $a^2$-fold of the impedance $Z_X(f_0)$ at the frequency $f_0$ as illustrated in the following Formula (9).

[Equation 9]

$$Z_X(af_0) = \dfrac{Z_b(af_0)^2}{Z_L} = \dfrac{\{a \cdot Z_b(f_0)\}^2}{Z_L} = a^2 \cdot \dfrac{Z_b(f_0)^2}{Z_L} = a^2 \cdot Z_X(f_0) \quad (9)$$

As a result, fluctuations with respect to the frequency are cancelled out as illustrated in the following Formula (10), and the impedance $Z_{out}(af_0)$ at the frequency $af_0$ obtained when the load $Z_L$ is viewed from the output terminals of the switch-mode amplifiers 100-1 and 100-2, . . . has the same value as the impedance $Z_{out}(f_0)$ at the frequency $f_0$. Specifically, the impedance correction unit 203 is disposed at the subsequent stage of the signal-synthesizing circuit 200, which allows the impedance $Z_{out}$ obtained when the load $Z_L$ is viewed from the output terminals of the switch-mode amplifiers 100-1 and 100-2, . . . to be maintained at the same value with respect to a change in the transmission frequency.

[Equation 10]

$$Z_{out}(af_0) = \dfrac{Z_b(af_0)^2}{n \cdot Z_X(af_0)} = \dfrac{\{a \cdot Z_a(f_0)\}^2}{n \cdot a^2 \cdot Z_X(f_0)} = Z_{out}(f_0) \quad (10)$$

Accordingly, in the transmitter of the first configuration example, the isolation between the switch-mode amplifiers 100-1 and 100-2, . . . can be secured, and the signal synthesis can be performed in the state where the impedance $Z_{out}$ and the output power associated with the impedance are maintained at the same value with respect to the transmission signals of a plurality of radio frequencies, even when variable passive elements are limited only to capacitance parts.

Further, since the signal synthesis can be performed while the isolation can be secured for the plurality of transmission frequencies, an S/N ratio (signal to noise ratio) can also be improved.

In the case of the first configuration example, as described above, signals other than the fundamental frequency are reflected by the variable filters 201-1 and 201-2 and are therefore not transmitted to the load 300. Thus, the efficiency of the transmission amplifier can be improved and spurious characteristics can be improved due to attenuation of harmonics.

Further, the implementation of the high-efficiency transmitter by controlling the operation pattern of each switch-mode amplifier 100 as described in the above-mentioned PTL1 can be applied to the transmitter in the first configuration example that is compatible with a plurality of transmission frequencies.

Note that the voltage/current source conversion units 202-1 and 202-2 and the impedance correction unit 203 in the first configuration example are not limited only to the circuit configurations of the bridged T-coil illustrated in FIGS. 3A and 4A, respectively. For example, as the π-type equivalent circuit of the ¼ wavelength transmission line configured using the variable shunt capacitances illustrated in FIGS. 3B and 4B, or the voltage/current source conversion units 202-1 and 202-2, a T-type equivalent circuit of a ¼ wavelength transmission line configured using the variable series capacitance as illustrated in FIG. 3C can be used. Alternatively, use of an equivalent circuit configured using other variable capacitances makes it possible to implement the voltage/current source conversion units in the same manner as described above.

Figure 3B:
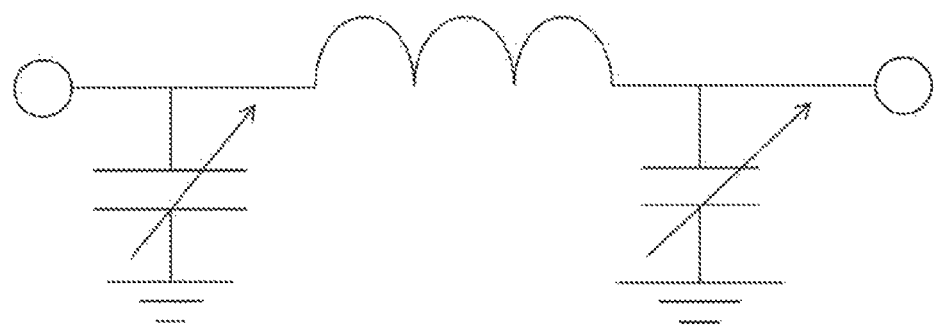
FIG. 3B is a circuit diagram illustrating another configuration example of the voltage/current source conversion unit of the signal-synthesizing circuit illustrated in FIG. 2A as the first configuration example.
Figure 3C:
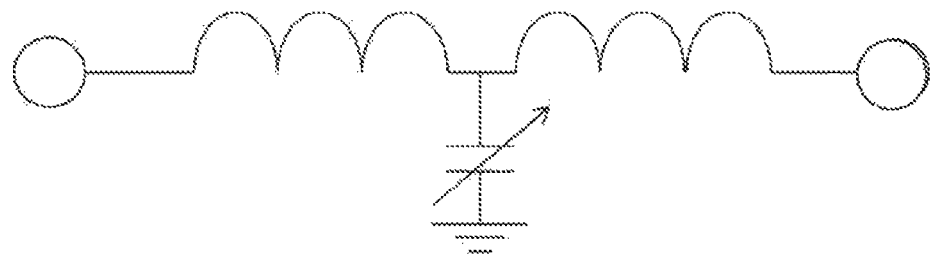
FIG. 3C is a circuit diagram illustrating still another configuration example of the voltage/current source conversion unit of the signal-synthesizing circuit illustrated in FIG. 2A as the first configuration example.
Figure 4B:
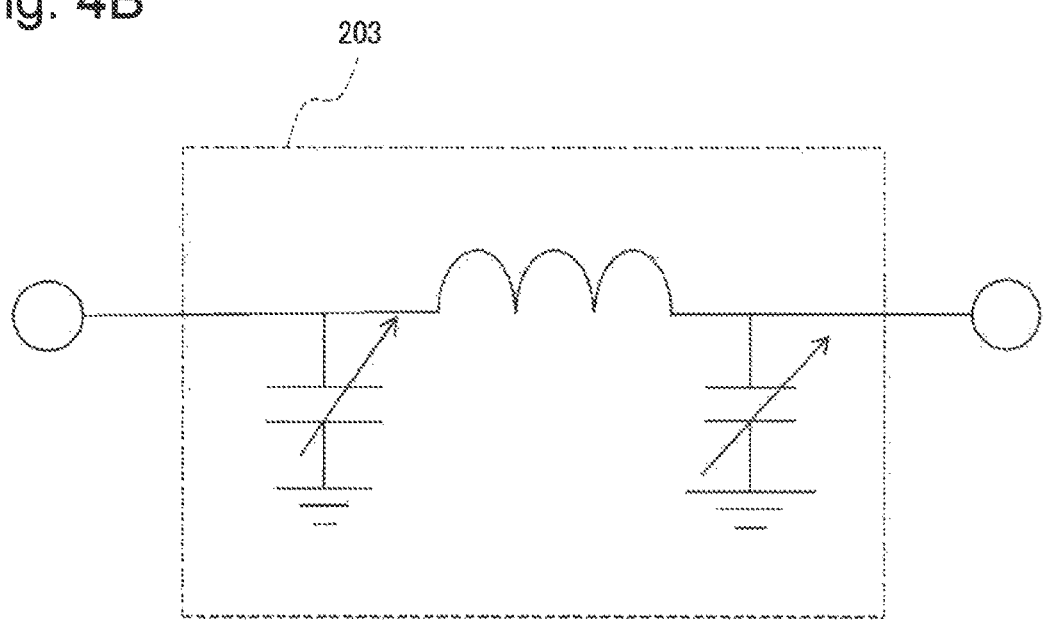
FIG. 4B is a circuit diagram illustrating another specific circuit configuration example of the impedance correction unit disposed at the subsequent stage of the signal-synthesizing circuit illustrated in FIG. 2A as the first configuration example.

In this regard, FIG. 3B is a circuit diagram illustrating another configuration example of the voltage/current source conversion units 202-1 and 202-2 of the signal-synthesizing circuit 200 illustrated in FIG. 2A as the first configuration example. FIG. 4B is a circuit diagram illustrating another specific circuit configuration example of the impedance correction unit 203 which is disposed at the subsequent stage of the signal-synthesizing circuit 200 illustrated in FIG. 2A as the first configuration example. FIG. 3C is a circuit diagram illustrating still another configuration example of the voltage/current source conversion units 202-1 and 202-2 of the signal-synthesizing circuit illustrated in FIG. 2A as the first configuration example.

Figure 4C:
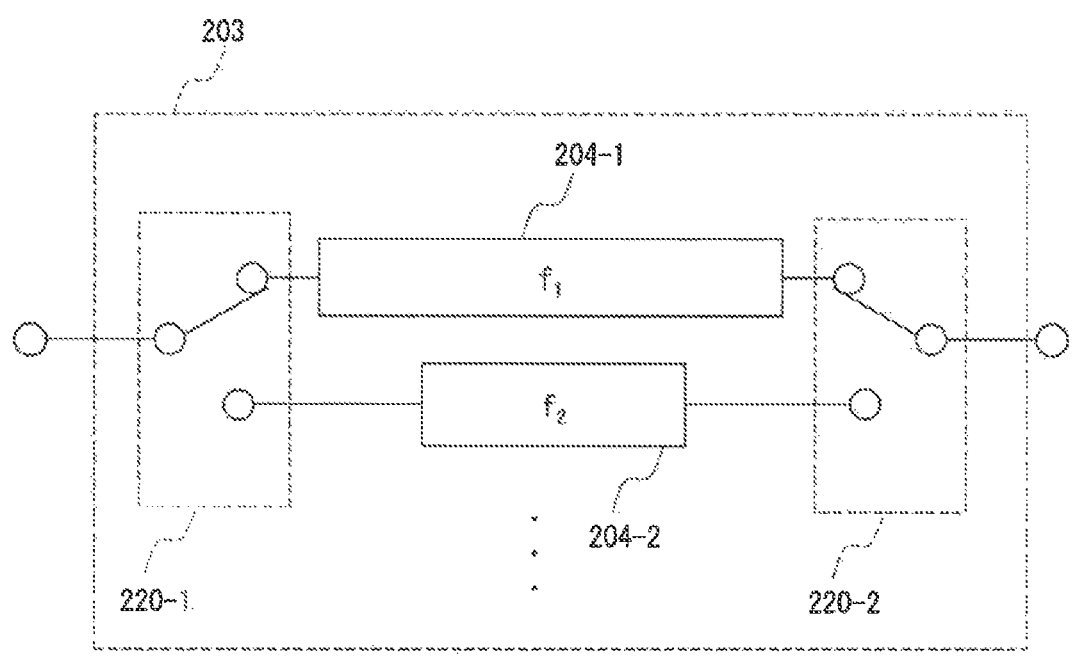
FIG. 4C is a circuit diagram illustrating still another specific circuit configuration example of the impedance correction unit disposed at the subsequent stage of the signal-synthesizing circuit illustrated in FIG. 2A as the first configuration example.

As illustrated in FIG. 4C, the impedance correction unit 203 of the first configuration example may have a circuit configuration in which the impedance transformer transmission lines 204-1, 204-2, . . . respectively corresponding to the transmission frequencies are switched for each frequency by the changeover switches 220-1 and 220-2. FIG. 4C is a circuit diagram illustrating still another specific circuit configuration example of the impedance correction unit 203 which is disposed at the subsequent stage of the signal-synthesizing circuit 200 illustrated in FIG. 2A as the first configuration example. Note that as the impedance transformer transmission lines 204-1, 204-2, . . . , ¼ wavelength transmission lines respectively corresponding to the transmission frequencies, and a bridged T-coil circuit, a π-type equivalent circuit, a T-type equivalent circuit, and the like which are lumped-constant equivalent circuits for the ¼ wavelength transmission lines, can be used.

Figure 6A:
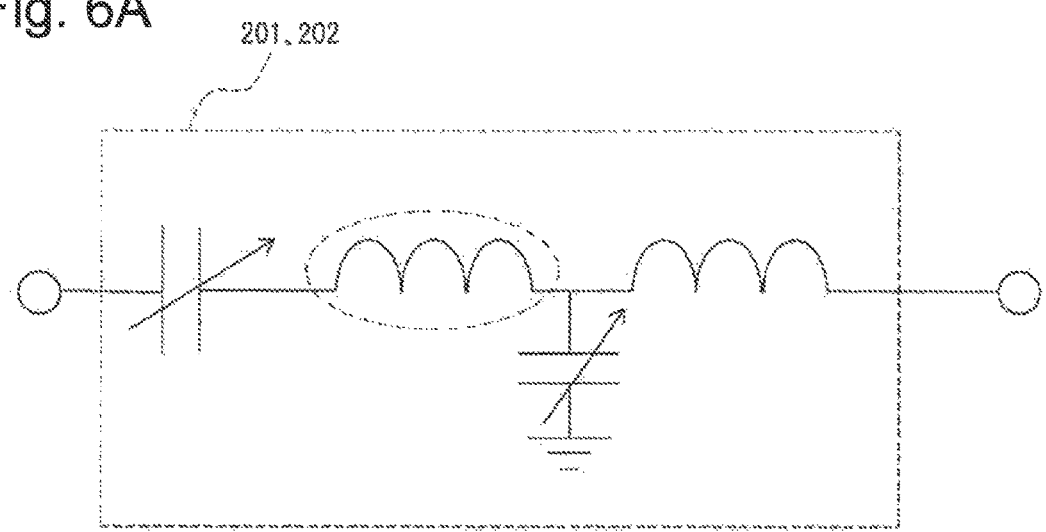
FIG. 6A is a circuit diagram illustrating a configuration example in which some of circuit elements of a voltage/current source conversion unit of the signal-synthesizing circuit illustrated in FIG. 2A as the first configuration example and a variable filter serving as a variable band-limiting unit are shared.

The voltage/current source conversion units 202-1 and 202-2 in the first configuration example and the variable filters 201-1 and 201-2 which are variable band-limiting units can share some of circuit elements, such as the inductor, as illustrated in FIG. 6A, thereby making it possible to reduce the number of elements. FIG. 6A is a circuit diagram illustrating a configuration example when some of the circuit elements of the voltage/current source conversion units 202-1 and 202-2 of the signal-synthesizing circuit 200 illustrated in FIG. 2A as the first configuration example and the variable filters 201-1 and 201-2 which are variable band-limiting units are shared, and illustrating a case where the inductor surrounded by an alternate long and short dash line is shared.

Note that the signal-synthesizing circuit 200 in the first configuration example is not limited to the configuration illustrated in FIG. 2A, and can be modified in various ways. Another configuration example different from FIG. 2A of the signal-synthesizing circuit 200 to which the transmitter according to an example embodiment of the present invention is applied will be described below.

(2) Second Configuration Example

FIG. 2B is a block diagram illustrating a second configuration example of a basic configuration of a signal-synthesizing circuit 200A in the transmitter illustrated in FIG. 1. To avoid the signal-synthesizing circuit from being mixed up with the signal-synthesizing circuit 200 illustrated in FIG. 2A as the first configuration example, a symbol 'A' is assigned to the end of the reference symbol of the signal-synthesizing circuit and the signal-synthesizing circuit is denoted as the signal-synthesizing circuit 200A. The configuration of the signal-synthesizing circuit 200A illustrated in FIG. 2B as the second configuration example differs from the configuration of the signal-synthesizing circuit 200 illustrated in FIG. 2A as the first configuration example in that the position of the variable filter 201-1, which is one of the variable band-limiting units, is replaced by the position of the voltage/current source conversion unit 202-1, and the position of the variable filter 201-2, which is the other one of the variable band-limiting units, is replaced by the position of the voltage/current source conversion unit 202-2.

Also in the case of the second configuration example illustrated in FIG. 2B, signals other than the fundamental frequency are reflected by the variable filters 201-1 and 201-2, and are therefore not transmitted to the load 300. Accordingly, the efficiency of the transmission amplifier can be improved and spurious characteristics can also be improved. Other advantageous effects are totally the same as those of the signal-synthesizing circuit 200 illustrated in FIG. 2A as the first configuration example.

Figure 5B:
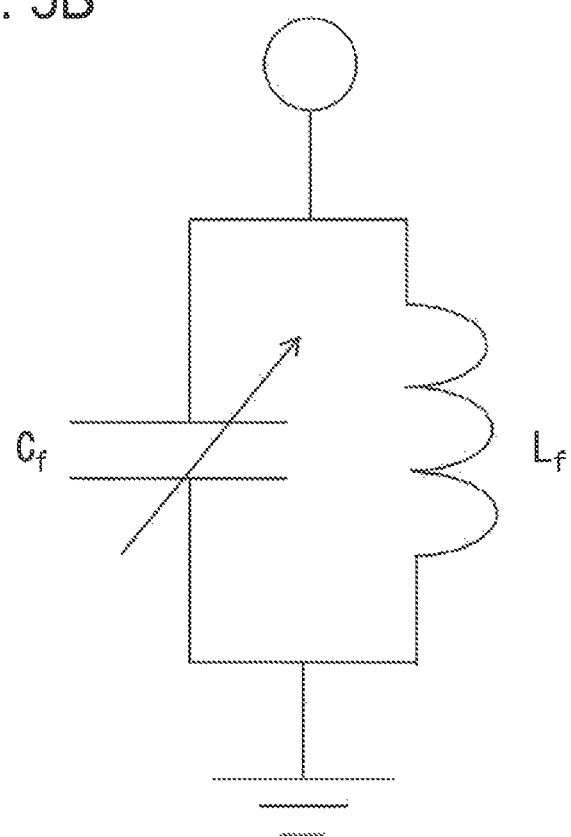
FIG. 5B is a circuit diagram illustrating a circuit configuration example of a variable filter of the signal-synthesizing circuit illustrated in FIG. 2B as the second configuration example.

Note that in the case of the second configuration example, the voltage/current source conversion units 202-1 and 202-2 disposed at the pre-stage of the variable filters 201-1 and 201-2 perform the voltage-to-current conversion, the variable filters 201-1 and 201-2 are equivalently connected to the current sources of the currents I1 and I2, respectively. Therefore, the LC parallel resonance circuit in which the variable capacitor $C_f$ and the inductor $L_f$ are connected in parallel as illustrated in FIG. 5B, is desirably used for the variable filter 201-1 and the variable filter 201-2, unlike the variable filter 201-1 and the variable filter 201-2 illustrated in FIG. 5A as the first configuration example. FIG. 5B is a circuit diagram illustrating a circuit configuration example of the variable filters 201-1 and 201-2 of the signal-synthesizing circuit 200A illustrated in FIG. 2B as the second configuration example.

Figure 6B:
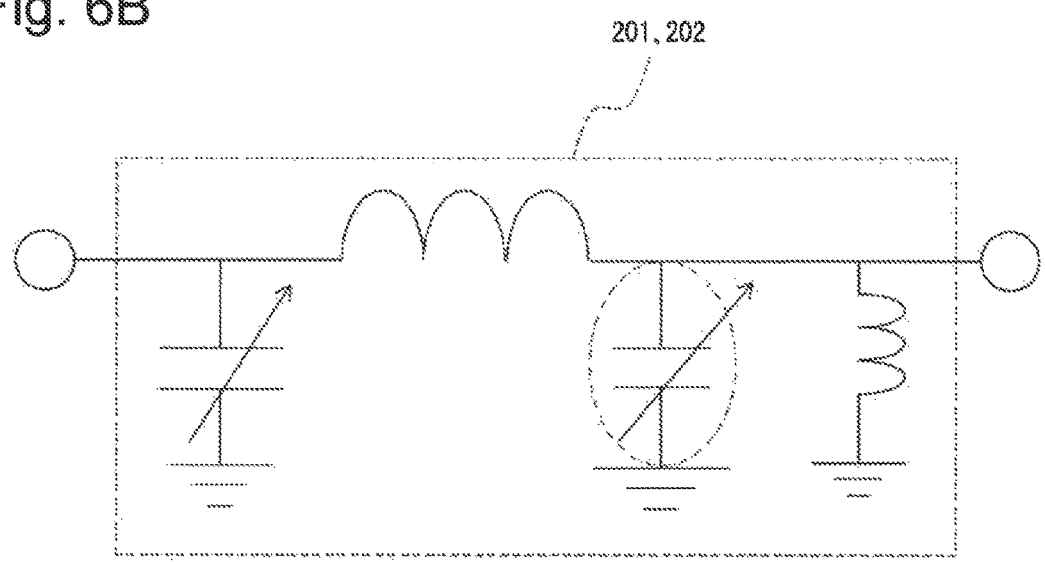
FIG. 6B is a circuit diagram illustrating a configuration example in which some of circuit elements of the voltage/current source conversion unit of the signal-synthesizing circuit illustrated in FIG. 2B as the second configuration example and a variable filter serving as a variable band-limiting unit are shared.

As illustrated in FIG. 6B, the voltage/current source conversion units 202-1 and 202-2 in the second configuration example and the variable filters 201-1 and 201-2 serving as a variable band-limiting unit can share some of circuit elements, such as the variable capacitance unit, as illustrated in FIG. 6B, thereby making it possible to reduce the number of elements. FIG. 6B is a circuit diagram illustrating a configuration example when some of the circuit elements of the voltage/current source conversion units 202-1 and 202-2 of the signal-synthesizing circuit 200A illustrated in FIG. 2B as the second configuration example and the variable filters 201-1 and 201-2, which are variable band-limiting units, are shared, and illustrating a case where the variable capacitance unit surrounded by an alternate long and short dash line is shared.

(3) Third Configuration Example

FIG. 2C is a block diagram illustrating a third configuration example of a basic configuration of a signal-synthesizing circuit 200B in the transmitter illustrated in FIG. 1. To avoid the signal-synthesizing circuit from being mixed up with the signal-synthesizing circuit 200 illustrated in FIG. 2A as the first configuration example, a symbol 'B' is assigned to the end of the reference symbol of the signal-synthesizing circuit and the signal-synthesizing circuit is denoted as the signal-synthesizing circuit 200B. When compared with the configuration of the signal-synthesizing circuit 200 illustrated in FIG. 2A as the first configuration example, the configuration of the signal-synthesizing circuit 200B illustrated in FIG. 2C as the third configuration example has the variable filters 201-1 and 202-2 omitted and output nodes of the pre-stage switch-mode amplifiers 100-1 and 100-2 connected directly to the voltage/current source conversion units 202-1 and 202-2, respectively, and a variable filter 201-1A newly disposed at the subsequent stage side (i.e., on a signal path between the synthesizing point X and the impedance correction unit 203) of the synthesizing point X, in place of the omitted variable filters 201-1 and 202-2. In this configuration, the variable filter 201-1A disposed at the subsequent stage side of the synthesizing point X constitutes the variable band-limiting unit.

Also in the case of the third configuration example, signals other than the fundamental frequency are reflected by the variable filter 201-1A, and are therefore not transmitted to the load 300. Thus, the efficiency of the transmission amplifier can be improved and spurious characteristics can also be improved. Other advantageous effects are altogether the same as those of the signal-synthesizing circuit 200 illustrated in FIG. 2A as the first configuration example.

Note that in the case of the third configuration example, since the voltage/current source conversion units 202-1 and 202-2 disposed at the pre-stage of the variable filter 201-1A perform the voltage-to-current conversion, the variable filter 201-1A is equivalently connected to the current source of a current $I_L$ (=I1+I2). Accordingly, as in the case of the variable filters 201-1 and 201-2 of the second configuration example, the LC parallel resonance circuit in which the variable capacitor $C_f$ and the inductor $L_f$ are connected in parallel as illustrated in FIG. 5B is desirable as the variable filter 201-1A.

Figure 6C:
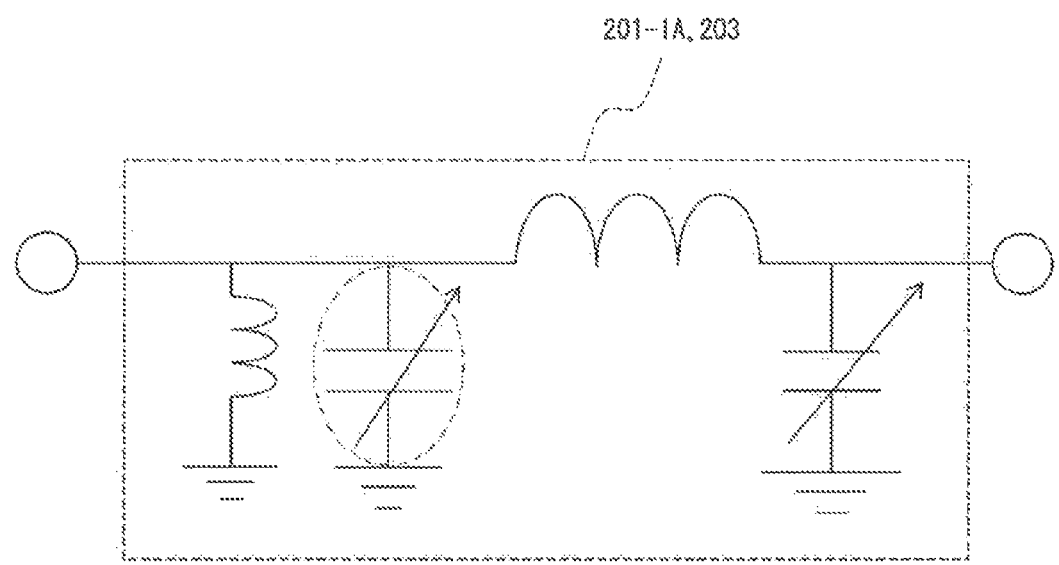
FIG. 6C is a circuit diagram illustrating a circuit configuration in which some of circuit elements of a variable filter serving as a variable band-limiting unit of the signal-synthesizing circuit illustrated in FIG. 2C as the third configuration example and an impedance correction circuit are shared.

Some of the circuit elements, such as the variable capacitance unit, of the variable filter 201-1A, which is the variable band-limiting unit in the third configuration example, and the impedance correction unit 203 are shared as illustrated in FIG. 6C, thereby making it possible to reduce the number of elements. FIG. 6C is a circuit diagram illustrating a configuration example when some of the circuit elements of the variable filter 201-1A, which is the variable band-limiting unit of the signal-synthesizing circuit 200B illustrated in FIG. 2C as the third configuration example, and the impedance correction unit 203 are shared, and illustrating a case where the variable capacitance unit surrounded by an alternate long and short dash line is shared.

(Supplementary Notes)

The present invention has been described in detail above with reference to example embodiments of the present invention. However, the example embodiments are merely examples of the present invention. The present invention is not limited only to the contents described in the example embodiments, and it is obvious that the configuration and details of the present invention can be modified in various ways which can be understood by those skilled in the art within the scope of the present invention. For example, while the example embodiments illustrate the case where the digital transmission signal is a 2-bit signal, the number of bits according to the present invention is not limited to two. The present invention can be applied to a case where the number of bits of the multi-bit digital transmission signal is two or more.

Further, in the example embodiments described above, the elements constituting the variable filters 201-1, 201-2, and 201-1A, the voltage/current source conversion units 202-1 and 202-2, the impedance correction unit 203, and the switch-mode amplifiers 100-1 and 100-2 have ideal characteristics, and the operation and advantageous effects of synthesizing the multi-bit signals have been described above. However, depending on the elements to be actually used, parasitic components of the elements may be compensated, and line shapes and element values may be changed to allow the phase of a voltage waveform or a current waveform to be closer to that for a more ideal signal-synthesizing operation. Furthermore, it is needless to say that modifications such as an addition of an element for compensation may be made.

This application is based upon and claims the benefit of priority from Japanese patent application No. 2014-234630, filed on Nov. 19, 2014, the disclosure of which is incorporated herein in its entirety by reference.

REFERENCE SIGNS LIST 100-1 Switch-mode amplifier
100-2 Switch-mode amplifier
200 Signal-synthesizing circuit
200A Signal-synthesizing circuit
200B Signal-synthesizing circuit
201-1 Variable filter (variable band-limiting unit)
201-1A Variable filter (variable band-limiting unit)
201-2 Variable filter (variable band-limiting unit)
202-1 Voltage/current source conversion unit
202-2 Voltage/current source conversion unit
203 Impedance correction unit
204-1 Impedance transformer transmission line
204-2 Impedance transformer transmission line
205-1 Open stab
205-2 Open stab
206-1 Open stab
207-1 Transmission line transformer
208-1 Transmission line transformer
208-2 Transmission line transformer
220-1 Changeover switch
220-2 Changeover switch
220-3 Changeover switch
220-4 Changeover switch
220-5 Changeover switch
220-6 Changeover switch
300 Antenna (load)
410 Digital baseband signal generation unit (DBB signal generation unit)
420 Modulation circuit
421 IQ modulator
422 Converter
423 Modulator
424 Integrator
425 Decoder
X Synthesizing point

The invention claimed is:

1. A transmitter comprising:
a modulation circuit configured to modulate a baseband signal into a multi-bit digital signal including a component in a radio frequency band;
a switch-mode amplifier disposed corresponding to each bit of the multi-bit digital signal output from the modulation circuit and configured to amplify the multi-bit digital signal on a bit-by-bit basis;
a signal-synthesizing circuit configured to signal-synthesize the multi-bit digital signal output from the respective switch-mode amplifiers as a transmission signal; and
an antenna configured to transmit the transmission signal, wherein
the signal-synthesizing circuit includes:
a frequency-variable band-limiting unit that band-limits an output signal from each of the switch-mode amplifiers;
a voltage/current source conversion unit that converts an output signal from each of the band-limiting unit from voltage to current, the voltage/current source conversion unit including at least a variable capacitance; and
a synthesizing point configured to connect output nodes of the respective voltage/current source conversion unit and synthesize output signals output from the respective voltage/current source conversion unit, and
the transmitter further comprises an impedance correction unit that corrects an impedance, the impedance correction unit being disposed on a signal path between the synthesizing point of the signal-synthesizing circuit and the antenna serving as a load.

2. The transmitter according to claim 1, wherein a frequency dependency of a characteristic impedance of the impedance correction unit matches a frequency dependency of a characteristic impedance of the voltage/current source conversion unit including the variable capacitance.

3. The transmitter according to claim 1, wherein the voltage/current source conversion unit including the variable capacitance is formed of any one of a bridged T-coil circuit, a π-type LC circuit, or a T-type LC circuit.

4. The transmitter according to claim 1, wherein the impedance correction unit is formed of any one of a bridged T-coil circuit including a variable capacitance unit, a π-type LC circuit including a variable capacitance unit, and a T-type LC circuit including a variable capacitance unit, or is formed of a circuit including an impedance transformer transmission line disposed corresponding to each transmission frequency, and a changeover switch used for switching the impedance transformer transmission line for each transmission frequency.

5. The transmitter according to claim 1, wherein the band-limiting unit is formed of an LC series resonance circuit including a variable capacitance and an inductor, being connected in series.

6. The transmitter according to claim 1, wherein
a disposition position of the band-limiting unit is replaced with a disposition position of the voltage/current source conversion unit,
the voltage/current source conversion unit converts an output signal from each of the switch-mode amplifiers from voltage to current, and
the band-limiting unit band-limits an output signal from each of the voltage/current source conversion unit.

7. The transmitter according to claim 6, wherein the band-limiting unit is formed of an LC parallel resonance circuit including a variable capacitance and an inductor, being connected in parallel.

8. The transmitter according to claim 1, wherein the transmitter is configured in such a manner that a variable filter for band-limiting is newly disposed on a signal path between the synthesizing point and the impedance correction unit, instead of omitting the band-limiting unit.

9. A signal-synthesizing circuit that is disposed in a transmitter including: a modulation circuit configured to modulate a baseband signal into a multi-bit digital signal including a component in a radio frequency band; a switch-mode amplifier disposed corresponding to each bit of the multi-bit digital signal output from the modulation circuit and configured to amplify the multi-bit digital signal on a bit-by-bit basis; and an antenna configured to transmit a transmission signal, and signal-synthesizes the multi-bit digital signal output from the respective switch-mode amplifiers as the transmission signal, the signal-synthesizing circuit comprising:
    a frequency-variable band-limiting unit that band-limits an output signal from each of the switch-mode amplifiers;
    a voltage/current source conversion unit that converts an output signal from each of the band-limiting means from voltage to current, the voltage/current source conversion unit including at least a variable capacitance; and
    a synthesizing point configured to connect output nodes of the respective voltage/current source conversion unit and synthesize output signals output from the respective voltage/current source conversion unit,
    wherein an output signal from the synthesizing point is further output to the antenna via an impedance correction unit that corrects an impedance.

10. A signal-synthesizing method for signal-synthesizing a multi-bit digital signal output from each of switch-mode amplifiers as a transmission signal in a transmitter including: a modulation circuit configured to modulate a baseband signal into the multi-bit digital signal including a component in a radio frequency band; the switch-mode amplifier disposed corresponding to each bit of the multi-bit digital signal output from the modulation circuit and configured to amplify the multi-bit digital signal on a bit-by-bit basis; and an antenna configured to transmit the transmission signal, the signal-synthesizing method comprising:
    band-limiting in frequency variable manner each signal amplified in each of the switch-mode amplifiers;
    converting each signal band-limited in the band-limiting step from voltage to current by using at least a variable capacitance;
    synthesizing each signal converted to current in the voltage/current source conversion step; and
    correcting an impedance of a signal synthesized in the synthesizing step and outputting the signal to the antenna.

* * * * *